US012791621B2

(12) United States Patent
Mihashi et al.

(10) Patent No.: US 12,791,621 B2
(45) Date of Patent: Nov. 10, 2026

(54) IMPEDANCE MEASUREMENT DEVICE

(71) Applicant: Nuvoton Technology Corporation Japan, Kyoto (JP)

(72) Inventors: Tetsuya Mihashi, Kyoto (JP); Takuya Ishii, Osaka (JP)

(73) Assignee: Nuvoton Technology Corporation Japan, Kyoto (JP)

(*) Notice: Subject to any disclaimer, the term of this patent is extended or adjusted under 35 U.S.C. 154(b) by 3 days.

(21) Appl. No.: 18/745,445

(22) Filed: Jun. 17, 2024

(65) Prior Publication Data

US 2024/0337700 A1 Oct. 10, 2024

Related U.S. Application Data

(63) Continuation of application No. PCT/JP2022/045763, filed on Dec. 13, 2022.

(30) Foreign Application Priority Data

Dec. 27, 2021 (JP) ................................ 2021-212197

(51) Int. Cl.
*G01R 31/389* (2019.01)
*G01R 31/3842* (2019.01)
*G01R 35/00* (2006.01)

(52) U.S. Cl.
CPC ....... *G01R 31/389* (2019.01); *G01R 31/3842* (2019.01)

(58) Field of Classification Search
CPC .. G01R 35/00; G01R 31/389; G01R 31/3842; G01R 31/392
See application file for complete search history.

(56) References Cited

U.S. PATENT DOCUMENTS

2007/0132456 A1 6/2007 Salman et al.
2016/0363634 A1 12/2016 Cheng et al.
(Continued)

FOREIGN PATENT DOCUMENTS

JP 2010-169527 A 8/2010
JP 2018-520343 A 7/2018
(Continued)

OTHER PUBLICATIONS

International Search Report dated Feb. 28, 2023 issued in International Patent Application No. PCT/JP2022/045763, with English machine translation.
(Continued)

*Primary Examiner* — Giovanni Astacio-Oquendo
*Assistant Examiner* — Temilade S Rhodes-Vivour
(74) *Attorney, Agent, or Firm* — Rimon P.C.

(57) ABSTRACT

An impedance measurement device includes: a switching circuit that forms a loop circuit together with a battery; a current measurer connected to a path connecting the battery and the switching circuit; and a voltage measurement device connected to both ends of the battery, in which the switching circuit generates a current flowing intermittently through the loop circuit from the battery, and the impedance measurement device: changes a time during which the current flows intermittently and a time during which the current does not flow to sweep a frequency of an alternating current from the battery; and measures the alternating current using the current measurer and measures an alternating current voltage of the battery using the voltage measurement device to derive an alternating current impedance of the battery.

13 Claims, 10 Drawing Sheets

(56) References Cited

U.S. PATENT DOCUMENTS

| | | | | |
|---|---|---|---|---|
| 2017/0003354 A1* | 1/2017 | Morrison | G01R 31/3842 |
| 2017/0160348 A1* | 6/2017 | Din | G01R 31/389 |
| 2017/0185733 A1* | 6/2017 | Nogueira | A61B 5/1495 |
| 2018/0056809 A1* | 3/2018 | Uchida | B60L 3/0046 |
| 2019/0280690 A1* | 9/2019 | Mahler | H03K 17/9537 |
| 2021/0109160 A1 | 4/2021 | Matsukawa et al. | |

FOREIGN PATENT DOCUMENTS

| | | |
|---|---|---|
| WO | 2016/198959 A1 | 12/2016 |
| WO | 2020/003841 A1 | 1/2020 |

OTHER PUBLICATIONS

Din, Eric et al., "A Scalable Active Battery Management System With Embedded Real-Time Electrochemical Impedance Spectroscopy", IEEE Transactions On Power Electronics, vol. 32, No. 7, Jul. 2017.

Din, Eric et al., "Online Spectroscopic Diagnostics Implemented in an Efficient Battery Management System", 2015 IEEE 16th Workshop on Control and Modeling for Power Electronics (COMPEL).

* cited by examiner

IMPEDANCE MEASUREMENT DEVICE

CROSS REFERENCE TO RELATED APPLICATION

This is a continuation application of PCT International Application No. PCT/JP2022/045763 filed on Dec. 13, 2022, designating the United States of America, which is based on and claims priority of Japanese Patent Application No. 2021-212197 filed on Dec. 27, 2021. The entire disclosures of the above-identified applications, including the specifications, drawings and claims are incorporated herein by reference in their entirety.

FIELD

The present disclosure relates to an impedance measurement device for measuring an alternating current impedance of a battery.

BACKGROUND

In recent years, devices for measuring an alternating current impedance of a battery have been known. As an example of this type of the device, PTL 1 discloses a device that efficiently extracts the properties of a battery. This device extracts the properties of a battery by passing a high-current pulse through the battery.

CITATION LIST

Patent Literature

PTL 1: Japanese Unexamined Patent Application Publication (Translation of PCT Application) No. 2018-520343

SUMMARY

Technical Problem

Unfortunately, the device disclosed in PTL 1 extracts the properties of a battery using a single frequency, and thus it is impossible to appropriately obtain, for example, the alternating current impedance of the battery which is needed to diagnose deterioration of the battery.

The object of the present disclosure is to provide an impedance measurement device capable of appropriately obtaining the alternating current impedance of a battery.

Solution to Problem

An impedance measurement device according to one aspect of the present disclosure includes: a switching circuit that forms a loop circuit together with a battery; a current measurer connected to a path connecting the battery and the switching circuit; and a voltage measurement device connected to both ends of the battery, in which the switching circuit generates a current flowing intermittently through the loop circuit from the battery, and the impedance measurement device: changes a time during which the current flows intermittently and a time during which the current does not flow to sweep a frequency of an alternating current from the battery; and measures the alternating current using the current measurer and measures an alternating current voltage of the battery using the voltage measurement device to derive an alternating current impedance of the battery.

An impedance measurement device according to one aspect of the present disclosure includes: a discharge switch, a limiting resistor, and part of a switching circuit which form a first loop circuit together with a battery; a current measurer connected to a path connecting the battery and the discharge switch; and a voltage measurement device connected to both ends of the battery, in which the discharge switch, the limiting resistor, and the part of the switching circuit generate a current flowing intermittently through the first loop circuit from the battery, and the impedance measurement device: changes a time during which the current flows intermittently and a time during which the current does not flow to sweep a frequency of an alternating current from the battery; and measures the alternating current using the current measurer and measures an alternating current voltage of the battery using the voltage measurement device to derive an alternating current impedance of the battery.

Advantageous Effects

The impedance measurement device according to the present disclosure is capable of appropriately obtaining the alternating current impedance of a battery.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
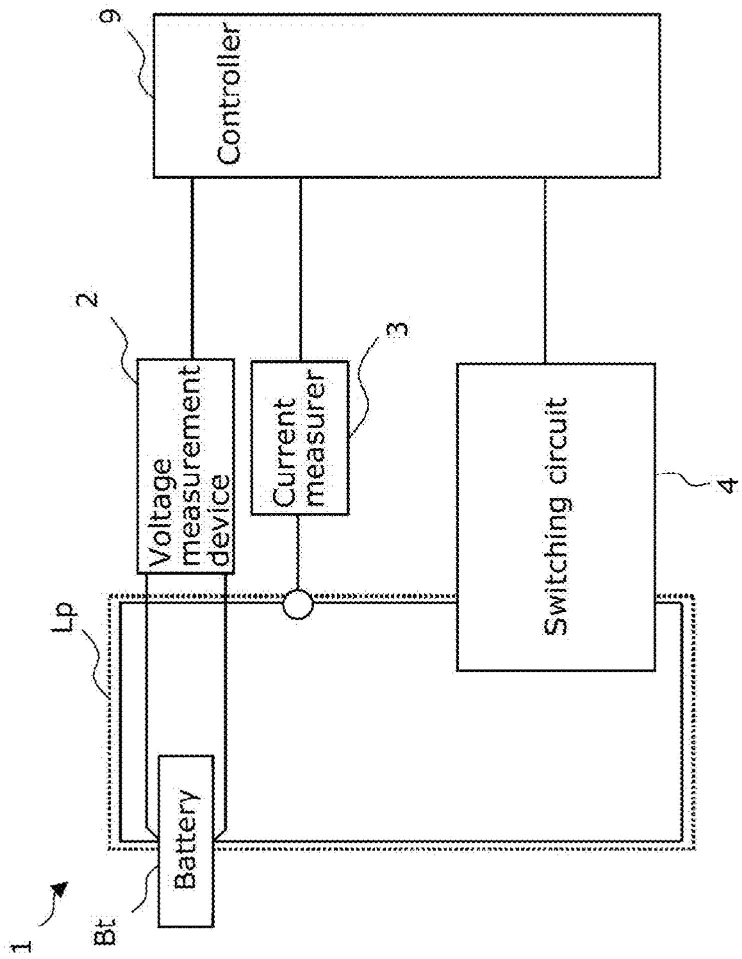
FIG. 1 is a diagram illustrating the schematic configuration of an impedance measurement device according to Embodiment 1.

In order to diagnose deterioration of a battery, a method of measuring the alternating current impedance of the battery is known.

In a battery, a component dominating the alternating current impedance (e.g., a positive electrode, an negative electrode, electrolyte solution, a parasitic resistance, or a parasitic inductance) is different for each measurement frequency. For this reason, for example, in measurement at a single frequency, it is impossible to obtain the alternating current impedance at frequency corresponding to each component, and thus it is also impossible to sufficiently diagnose deterioration of the battery.

In contrast, the impedance measurement device according to the present disclosure derives the alternating current impedance of a battery by measuring the alternating current and the alternating current voltage while sweeping the frequency of the current from the battery. With this configuration, it is possible to obtain the alternating current impedance at frequency corresponding to each component of the battery, thereby allowing for appropriate deterioration diagnosis for the battery.

Moreover, energy is discharged from the battery in measuring the alternating current impedance, and thus the state of charge (SOC) of the battery changes. For example, in the method of measuring the alternating current impedance while sweeping the frequency as described above, the SOC of the battery is slightly different for each measurement frequency. For this reason, the precondition for measuring the alternating current impedance is different for each frequency, and thus it may be impossible to appropriately diagnose deterioration of the battery.

Accordingly, the impedance measurement device according to the present disclosure stores the energy drawn from the battery during the measurement of the alternating current impedance and regenerates the stored energy into the battery before the next measurement. With this configuration, it is possible to appropriately obtain the alternating current impedance, thereby allowing for appropriate deterioration diagnosis for the battery.

Hereinafter, embodiments are described in details with reference to the drawings. It is to be noted that the embodiments described below each shows a specific example. The numerical values, shapes, materials, structural elements, the arrangement and connection of the structural elements, steps, the order of steps, etc., illustrated in the following embodiments are mere examples, and therefore do not limit the present disclosure. Moreover, among the structural elements in the following embodiments, those not recited in any of the independent claims are described as optional structural elements.

It is to be noted that each of the drawings is a schematic diagram, and thus is not always illustrated precisely. Throughout the drawings, substantially the same elements are assigned with the same numerical references, and overlapping descriptions are omitted or simplified.

Embodiment 1

[Configuration of Impedance Measurement Device]

The following describes the schematic configuration of an impedance measurement device according to Embodiment 1.

FIG. 1 is a diagram illustrating the schematic configuration of impedance measurement device 1 according to Embodiment 1. It is to be noted that FIG. 1 also illustrates battery Bt which is a measurement target.

Impedance measurement device 1 is a device that measures the alternating current impedance of battery Bt. Battery Bt is a secondary battery capable of being charged and discharged, e.g., a lithium-ion battery.

As illustrated in FIG. 1, impedance measurement device 1 includes switching circuit 4 forming loop circuit Lp together with battery Bt, current measurer 3 connected to a path connecting battery Bt and switching circuit 4, and voltage measurement device 2 connected to the both ends of battery Bt. Impedance measurement device 1 also includes controller 9 that controls switching circuit 4 and the like.

Switching circuit 4 generates a current flowing intermittently through loop circuit Lp from battery Bt. The intermittent current refers to, for example, a current having pulse waveforms (see FIG. 3).

This impedance measurement device 1 changes a time during which the current flows intermittently through loop circuit Lp and a time during which the current does not flow to sweep the frequency of the alternating current from battery Bt. For example, controller 9 controls the operation cycle of switching circuit 4 to sweep the frequency of the alternating current through switching circuit 4.

While sweeping the frequency of the alternating current, impedance measurement device 1 measures the alternating current using current measurer 3 and measures the alternating current voltage of battery Bt using voltage measurement device 2 to derive the alternating current impedance of battery Bt. With this configuration, it is possible to appropriately obtain the alternating current impedance for diagnosing deterioration of the battery.

The following describes the detailed configuration of impedance measurement device 1.

Figure 2:
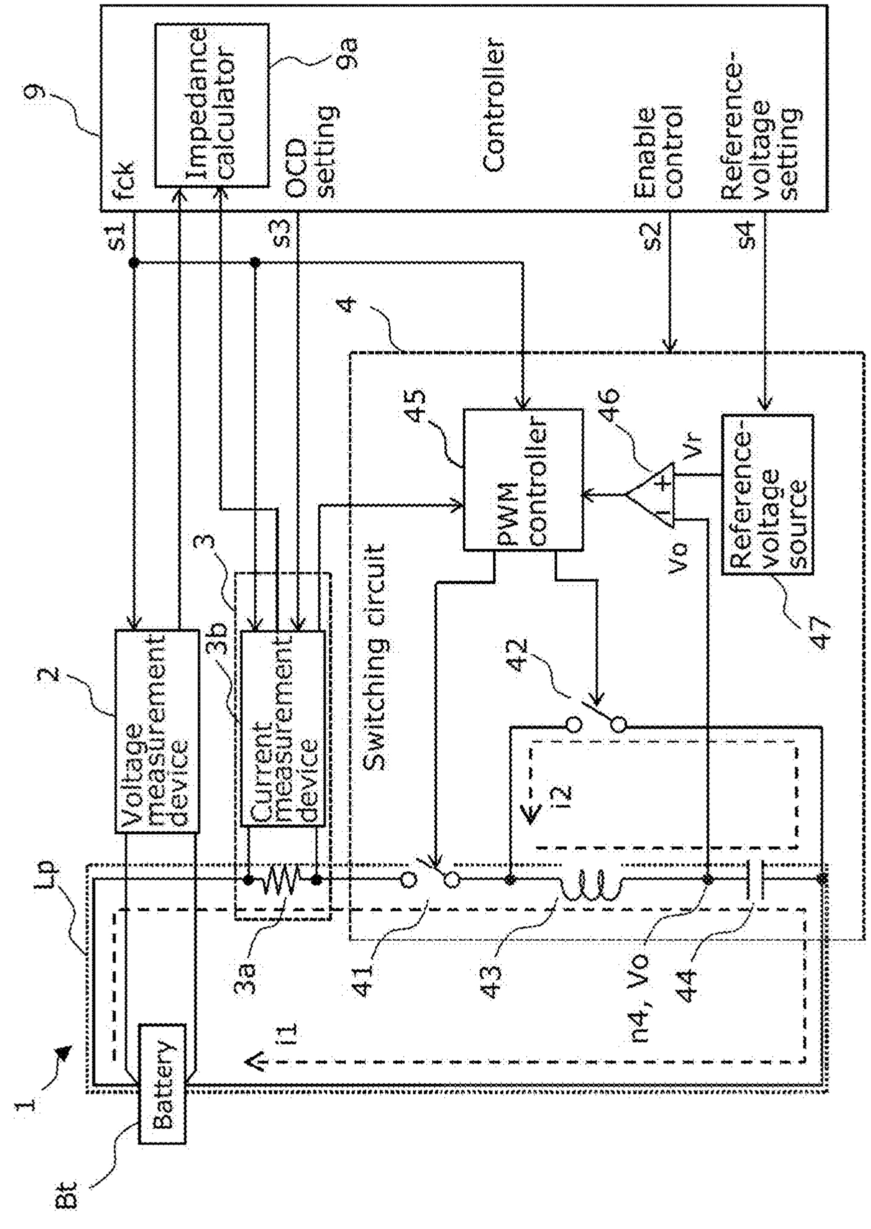
FIG. 2 is a circuit diagram illustrating the impedance measurement device according to Embodiment 1.
Figure 3:
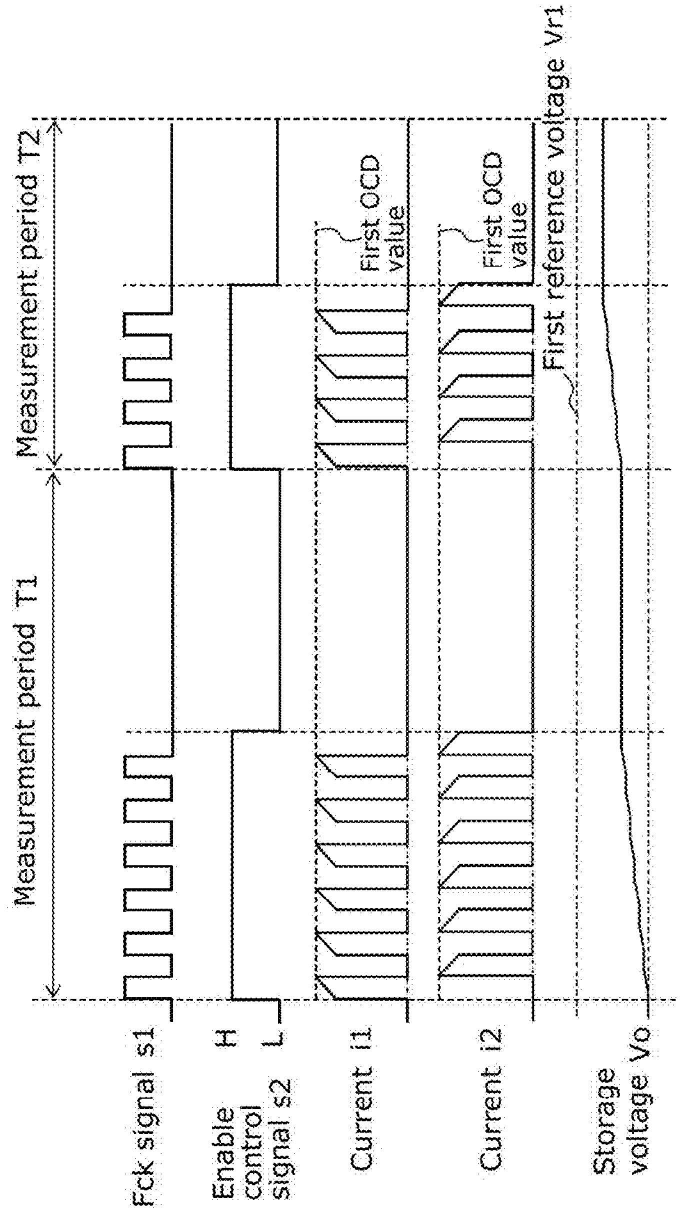
FIG. 3 is a timing chart illustrating the operation of the impedance measurement device in measuring the alternating current impedance of a battery.

FIG. 2 is a circuit diagram illustrating impedance measurement device 1 according to Embodiment 1. FIG. 3 is a timing chart illustrating the operation of impedance measurement device 1 in measuring the alternating current impedance of battery Bt. It is to be noted that FIG. 2 also illustrates current i1 and current i2 flowing through impedance measurement device 1 in measuring the alternating current impedance of battery Bt.

As illustrated in FIG. 2, impedance measurement device 1 includes switching circuit 4, current measurer 3, voltage measurement device 2, and controller 9. Controller 9 includes impedance calculator 9*a* for calculating the alternating current impedance of battery Bt.

Controller 9 is a circuit that controls voltage measurement device 2, current measurer 3, and switching circuit 4. For example, this circuit is implemented as a microprocessor including a program.

Controller 9 generates frequency clock (fck) signal s1, and outputs fck signal s1 to voltage measurement device 2, current measurer 3, and switching circuit 4. Fck signal s1 is generated as the logical AND of the fixed-frequency waveform, which is the basic clock of the microprocessor, and the measurement waveform in measuring the alternating current impedance (e.g., enable control signal s2 described later) (see FIG. 3). In the present embodiment, the frequency of the measurement waveform is set to continuously change to different frequencies.

Controller 9 also generates enable control signal s2 for controlling the operation cycle of switching circuit 4, and outputs enable control signal s2 to pulse width modulation (PWM) controller in switching circuit 4. For example, when enable control signal s2 is high (Hi), switching circuit 4 is activated, and when enable control signal s2 is low (Low), switching circuit 4 is stopped. Controller 9 sweeps the frequency of the alternating current from battery Bt by controlling the operation cycle of switching circuit 4 using enable control signal s2 (see FIG. 3).

Controller 9 also outputs predetermined overcurrent detection (OCD) setting signal s3 to current measurer 3. Controller 9 also outputs predetermined reference-voltage setting signal s4 to reference-voltage source 47 in switching circuit 4. OCD setting signal s3 and reference-voltage setting signal s4 are described later.

Current measurer 3 is connected to the path connecting battery Bt and switching circuit 4 on loop circuit Lp. Current measurer 3 includes current sense resistor 3*a* and current measurement device 3*b*. Current sense resistor 3*a* is inserted in series into the path connecting battery Bt and switching circuit 4. Current measurement device 3*b* detects a current by measuring a voltage across current sense resistor 3*a*. Current measurer 3 detects the alternating current from battery Bt based on fck signal s1 outputted from controller 9. The alternating current value detected by current measurer 3 is outputted to impedance calculator 9*a* in controller 9.

Moreover, current measurer 3 receives OCD setting signal s3 outputted from controller 9. For example, when the current value detected by current measurer 3 exceeds the first OCD value set by OCD setting signal s3, current measurer 3 outputs a current excess signal indicating that the current value has exceeded the first OCD value to PWM controller 45 in switching circuit 4.

Voltage measurement device 2 is connected to the both ends of battery Bt. For example, voltage measurement device 2 is connected to the positive terminal which is one of the both ends of battery Bt and the negative terminal which is the other of them. Voltage measurement device 2 detects the alternating current voltage of battery Bt based on fck signal s1 outputted from controller 9. The alternating current voltage value detected by voltage measurement device 2 is outputted to impedance calculator 9*a* in controller 9.

Impedance calculator 9*a* calculates the alternating current impedance of battery Bt based on the alternating current voltage value outputted from voltage measurement device 2 and the alternating current value outputted from current measurer 3. The alternating current impedance is a complex number which has a real component and an imaginary component. For example, impedance calculator 9*a* calculates the alternating current impedance by dividing the alternating current voltage value at a predetermined measurement frequency by the alternating current value.

Switching circuit 4 is loop-connected to battery Bt. For example, switching circuit 4 has ends one of which is connected to one end of battery Bt through current sense resistor 3*a*, and the other of which is connected to the other end of battery Bt.

Switching circuit 4 is a circuit for generating a current flowing intermittently through loop circuit Lp from battery Bt.

Switching circuit 4 includes first switch 41, inductor 43, and energy storage device 44 inserted in series on loop circuit Lp, and second switch 42 connected in parallel to inductor 43 and energy storage device 44. Switching circuit 4 also includes PWM controller 45, voltage comparator 46, and reference-voltage source 47.

One end of first switch 41 is connected to one end of battery Bt through current measurer 3. One end of inductor 43 is connected to the other end of first switch 41, and one end of energy storage device 44 is connected to the other end of inductor 43. The other end of energy storage device 44 is connected to the other end of battery Bt. Moreover, one end of second switch 42 is connected to the other end of first switch 41, and the other end of second switch 42 is connected to the other end of battery Bt.

First switch 41 and second switch 42 are each, for example, a field-effect transistor. First switch 41 is also referred to as a high-side switch in switching circuit 4, and second switch 42 is also referred to as a low-side switch in switching circuit 4. Inductor 43 is a device that exerts inductive effects, e.g., a winding coil. Energy storage device 44 is a device that stores energy drawn from battery Bt, e.g., a capacitor. It is to be noted that energy storage device 44 may be a secondary battery whose capacity is lower than that of battery Bt.

Switching circuit 4 controls turning on and off first switch 41 and second switch 42 using the PWM signal outputted from PWM controller 45. PWM controller 45 alternately turns on first switch 41 and second switch 42 in synchronization with fck signal s1 outputted from controller 9. In the measurement, first switch 41 is turned on and off by PWM controller 45 to generate current i1 flowing intermittently from battery Bt to energy storage device 44, and second switch 42 is turned on and off by PWM controller 45 to generate current i2 flowing intermittently from inductor 43 to energy storage device 44. As illustrated in FIG. 3, current i1 and current i2 are alternately and repeatedly generated.

Switching circuit 4 is also a circuit for generating the alternating current flowing from battery Bt. The operation cycle of switching circuit 4 is controlled by switching enable control signal s2 outputted from controller 9. For example, controller 9 changes enable control signal s2 to high to activate switching circuit 4, and changes enable control signal s2 to low to stop switching circuit 4. In the present embodiment, the operation cycle of switching circuit 4 is changed to sweep the frequency of the alternating current from battery Bt through switching circuit 4.

Switching circuit 4 is also a circuit for changing the flow direction of the current flowing through loop circuit Lp. For example, switching circuit 4 switches the operation of impedance measurement device 1 between a measurement operation and a regenerative operation. Impedance measurement device 1 according to the present embodiment stores energy drawn from battery Bt in energy storage device 44 while measuring the alternating current and the alternating current voltage, and regenerates the energy stored in energy storage device 44 into battery Bt while not measuring the alternating current and the alternating current voltage.

For example, PWM controller 45 makes the ON time of first switch 41 longer than the ON time of second switch 42, i.e., increases the ON duty of first switch 41, thereby passing current i1 and current i2 to charge energy storage device 44. In contrast, PWM controller makes the ON time of second switch 42 longer than the ON time of first switch 41, i.e., increases the ON duty of second switch 42, thereby passing current i1 and current i2 to discharge electric charge stored in energy storage device 44 (see FIG. 4).

More specifically, PWM controller 45 controls turning on and off first switch 41 and second switch 42 based on the magnitude relationship between reference voltage Vr and storage voltage Vo in voltage comparator 46, to change the flow direction of the current flowing through loop circuit Lp or the like.

For example, reference-voltage source 47 is a reference-voltage generation circuit that generates reference voltage Vr. Reference-voltage source 47 generates reference voltage Vr based on reference-voltage setting signal s4 outputted from controller 9. Reference voltage Vr set by reference-voltage source 47 is, for example, first reference voltage Vr1 or second reference voltage Vr2 lower than first reference voltage Vr1. Second reference voltage Vr2 is an initial voltage of energy storage device 44 before the measurement. Controller 9 sets reference voltage Vr to first reference voltage Vr1 when the alternating current impedance of battery Bt is measured, whereas controller 9 sets reference voltage Vr to second reference voltage Vr2 when the energy stored in impedance measurement device 1 is regenerated into battery Bt. It is to be noted that reference-voltage source 47 may be provided outside switching circuit 4.

Voltage comparator 46 is a comparator that compares reference voltage Vr and storage voltage Vo of energy storage device 44. The non-inverting input terminal (+) of voltage comparator 46 is connected to reference-voltage source 47, and receives the voltage set by reference-voltage source 47. The inverting input terminal (−) of voltage comparator 46 receives electric potential at node n4 between inductor 43 and energy storage device 44, i.e., storage voltage Vo of energy storage device 44. The output terminal of voltage comparator 46 is connected to PWM controller 45. Based on the magnitude relationship between reference voltage Vr and storage voltage Vo, voltage comparator 46 outputs, to PWM controller 45, a duty control signal for controlling turning on and off the switches.

For example, when storage voltage Vo is lower than first reference voltage Vr1, voltage comparator 46 outputs the duty control signal to increase the ON duty of first switch 41 and pass current in the charging direction of energy storage device 44. According to this duty control signal, turning on and off the switches is controlled by PWM controller 45, and storage voltage Vo increases close to first reference voltage Vr1.

In contrast, when storage voltage Vo is higher than second reference voltage Vr2, voltage comparator 46 outputs the duty control signal to increase the ON duty of second switch 42 and pass current in the discharging direction of energy storage device 44. According to this duty control signal, turning on and off the switches is controlled by PWM controller 45, in which storage voltage Vo decreases close to the initial value and the discharged energy is regenerated into battery Bt.

As described above, impedance measurement device 1 stores the energy drawn from the battery during the measurement of the alternating current impedance, whereas regenerates the stored energy into the battery. With this configuration, it is possible to prevent the decrease in SOC of battery Bt. With this, it is possible to appropriately obtain the alternating current impedance of battery Bt, thereby allowing for appropriate deterioration diagnosis for battery Bt.

[Measurement Operation of Impedance Measurement Device]

The measurement operation of the impedance measurement device is described with reference to FIG. 2 and FIG. 3. FIG. 3 illustrates the time-series variations of fck signal s1, enable control signal s2, current i1, current i2, and storage voltage Vo. It is to be noted that, for the sake of easy understanding, the waveforms of current i1, current i2, and storage voltage Vo are schematically illustrated.

The period of 1 pulse of fck signal s1 illustrated in FIG. 3 is, for example, the reciprocal of frequency 1 kHz, and first measurement period T1 is, for example, the reciprocal of frequency 100 Hz. First measurement period T1 is also the reciprocal of the first measurement frequency, and second measurement period T2 is the reciprocal of the second measurement frequency. This example shows an example in which second measurement period T2 is shorter than first measurement period T1 and the second measurement frequency in frequency sweep is higher than the first measurement frequency.

Firstly, controller 9 sets first reference voltage Vr1 to a voltage higher than initial storage voltage Vo. Voltage comparator 46 outputs the duty control signal to PWM controller 45 so that storage voltage Vo increases close to first reference voltage Vr1. PWM controller 45 increases the ON duty of first switch 41 to pass current from inductor 43 to energy storage device 44. More specifically, switching circuit 4 controls current i1 and current i2 to alternately flow through at least part of loop circuit Lp. Current i1 and current i2 each have a pulsed waveform of an intermittent flow. Current i1 and current i2 flow as described above, and thus storage voltage Vo of energy storage device 44 gradually increases.

It is to be noted that when the current value detected by current measurer 3 exceeds the first OCD value set by OCD setting signal s3, current measurer 3 may output the current excess signal indicating that the current value has exceeded the first OCD value to PWM controller 45. For example, when receiving the current excess signal regarding current i1, PWM controller 45 turns off first switch 41 and turns on second switch 42 to block current flowing from battery Bt.

Current measurer 3 detects the alternating current flowing from battery Bt based on fck signal s1 outputted from controller 9. The alternating current value detected by current measurer 3 is outputted to impedance calculator 9*a* in controller 9. Voltage measurement device 2 detects the alternating current voltage of battery Bt based on fck signal s1 outputted from controller 9. The alternating current voltage value detected by voltage measurement device 2 is outputted to impedance calculator 9*a* in controller 9. Impedance calculator 9*a* derives the alternating current impedance of battery Bt based on the alternating current voltage outputted from voltage measurement device 2 and the alternating current outputted from current measurer 3.

[Regenerative Operation of Impedance Measurement Device]

The regenerative operation of impedance measurement device 1 is described with reference to FIG. 4.

Figure 4:
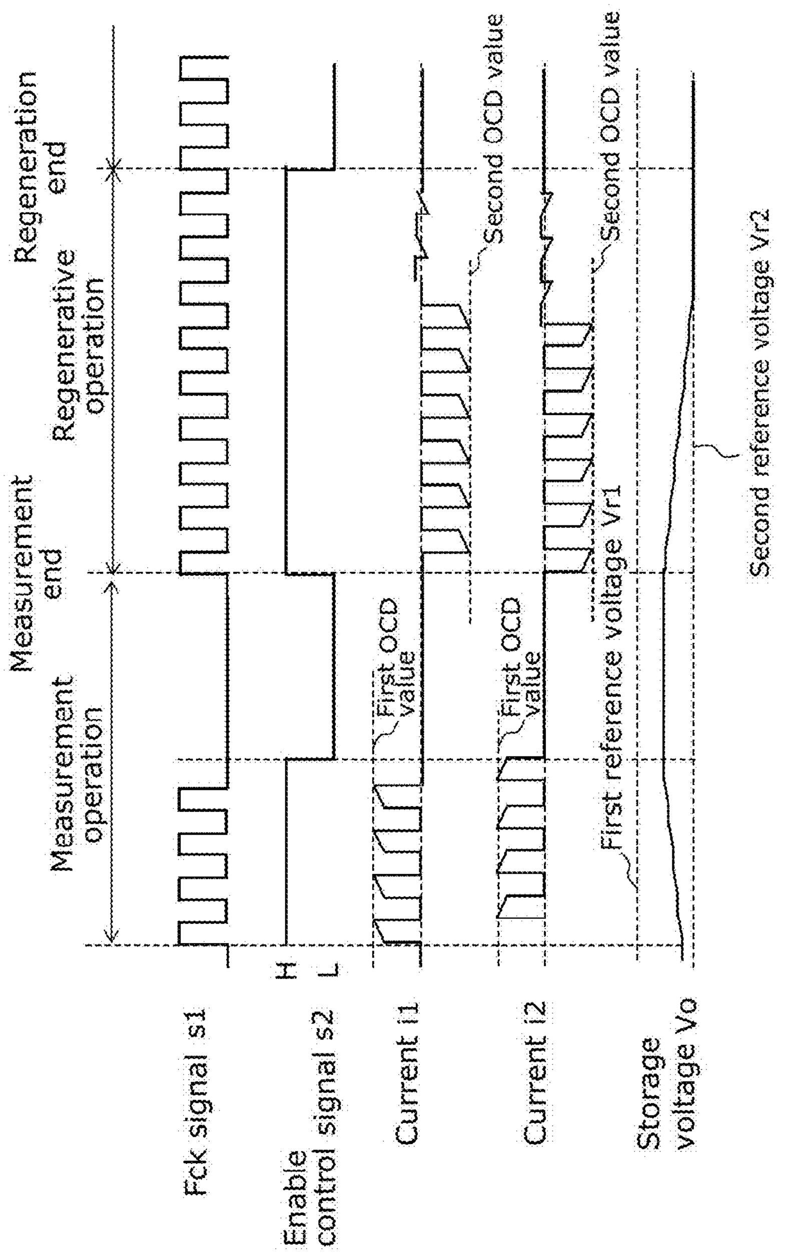
FIG. 4 is a timing chart illustrating the operation of the impedance measurement device in regenerating stored energy into the battery.

FIG. 4 is a timing chart illustrating the operation of impedance measurement device 1 in regenerating stored energy into battery Bt. FIG. 4 illustrates the time-series variations of fck signal s1, enable control signal s2, current i1, current i2, and storage voltage Vo. It is to be noted that the positive and negative of current i1 and current i2 are indicated on the assumption that the current flow direction denoted by the dashed arrow in FIG. 2 is positive.

After the measurement of the alternating current impedance, storage voltage Vo of energy storage device 44 is set back to the initial value, and the energy stored in energy storage device 44 is regenerated into battery Bt. In order to set the conditions in the next measurement to be the same as those in the prior measurement, storage voltage Vo is initialized and energy is regenerated into battery Bt. This example describes a case where the initialization of storage voltage Vo and the regeneration into battery Bt are performed after measurement at a predetermined frequency and before changing the frequency of the alternating current to a different frequency. It is to be noted that controller 9 can know the completion of the measurement at the predetermined frequency, and thus the operation is automatically switched from the measurement operation to the regenerative operation.

Firstly, controller 9 sets second reference voltage Vr2 to a voltage lower than storage voltage Vo immediately after the measurement, i.e., the initial voltage. Voltage comparator 46 outputs the duty control signal to PWM controller 45 so that storage voltage Vo decreases close to second reference voltage Vr2. PWM controller 45 increases the ON duty of second switch 42 to pass current from energy storage device 44 to inductor 43. More specifically, switching circuit 4 controls current i2 and current i1 to alternately flow through at least part of loop circuit Lp. Current i2 and current i1 each have a pulsed waveform of an intermittent flow. Current i2 and current i1 flow as described above, and thus storage voltage Vo gradually decreases.

It is to be noted that when the current value detected by current measurer 3 exceeds the second OCD value set by OCD setting signal s3, current measurer 3 may output the current excess signal indicating that the current value has exceeded the second OCD value to PWM controller 45. For example, when receiving the current excess signal regarding current i2, PWM controller 45 turns off second switch 42 and turns on first switch 41 to regenerate current into battery Bt. The current of inductor 43 gradually decreases, and thus it is possible to limit the regenerated current to the OCD value or less. In order to avoid the load suddenly exerted on battery Bt, the regenerative operation is performed while controlling current using switching circuit 4 as described above.

When storage voltage Vo reaches second reference voltage Vr2, first switch 41 and second switch 42 are turned on and off so that the average of current i2 and current i1 becomes 0. With this, storage voltage Vo of energy storage device 44 is set back to the initial voltage equal to the storage voltage before measurement.

Controller 9 changes enable control signal s2 to low to stop switching circuit 4. With this, the regenerative operation of impedance measurement device 1 ends. It is to be noted that the timing of the end of the regenerative operation may be, for example, a predetermined time. Alternatively, after the time when storage voltage Vo becomes constant is detected by monitoring the output from voltage comparator 46, the timing of the end of the regenerative operation may be set to a time after a predetermined period from the detected time.

This impedance measurement device 1 stores the energy drawn from battery Bt during the measurement of the alternating current impedance, and regenerates the stored energy into battery Bt before the next measurement.

Likewise, this impedance measurement device 1 can also charge battery Bt with energy from energy storage device 44 during the measurement of the alternating current impedance, and discharge the charged energy to energy storage device 44 before the next measurement. For example, such an aspect can be implemented by setting reference voltage Vr during measurement to a voltage lower than storage voltage Vo to pass charging current to battery Bt, and by setting reference voltage Vr to a voltage higher than storage voltage Vo to draw current from battery Bt, by the next measurement.

By feeding energy back into battery Bt as described above, for example, it can be prevented in measurement at each measurement frequency that the voltage of battery Bt is different. With this configuration, it is possible to appropriately obtain the alternating current impedance, thereby allowing for appropriate deterioration diagnosis for battery Bt.

[Advantageous Effects, Etc.]

Impedance measurement device 1 according to the present embodiment includes: switching circuit 4 that forms loop circuit Lp together with battery Bt; current measurer 3 connected to a path connecting battery Bt and switching circuit 4; and voltage measurement device 2 connected to both ends of battery Bt. Switching circuit 4 generates current i1 and current i2 flowing intermittently through loop circuit Lp from battery Bt. Impedance measurement device 1: changes a time during which current i1 and current i2 flow intermittently and a time during which current i1 and current i2 do not flow to sweep a frequency of an alternating current from battery Bt; and measures the alternating current using current measurer 3 and measures an alternating current voltage of battery Bt using voltage measurement device 2 to derive an alternating current impedance of battery Bt.

By measuring the alternating current and measuring the alternating current voltage while sweeping the frequency of the alternating current as described above, it is possible to appropriately obtain the alternating current impedance of battery Bt needed to diagnose deterioration of battery Bt.

Moreover, impedance measurement device 1 further includes controller 9 that controls switching circuit 4. Controller 9 may control an operation cycle of switching circuit 4 to sweep the frequency of the alternating current through switching circuit 4.

By controlling the operation cycle of switching circuit 4 as described above, the frequency of the alternating current can be appropriately swept through switching circuit 4. With this, it is possible to appropriately obtain the alternating current impedance in a frequency band needed to diagnose deterioration of battery Bt.

Moreover, switching circuit 4 includes inductor 43 and energy storage device 44 which are inserted in series on loop circuit Lp. Energy storage device 44 may store energy drawn from battery Bt while the alternating current and the alternating current voltage are measured, and impedance measurement device 1 may regenerate energy stored in energy storage device 44 into battery Bt while the alternating current and the alternating current voltage are not measured.

By storing energy drawn from battery Bt while measuring the impedance as described above and by regenerating the stored energy into battery Bt while not measuring the impedance as described above, variation in SOC of battery Bt can be prevented. With this, it is possible to appropriately obtain the alternating current impedance of battery Bt, thereby allowing for appropriate deterioration diagnosis for battery Bt.

Moreover, impedance measurement device 1 may regenerate energy stored in energy storage device 44 into battery Bt before changing the frequency of the alternating current to a different frequency.

By regenerating the stored energy into battery Bt before changing the frequency for the next measurement as described above, it can be prevented in measurement at each measurement frequency that the voltage of battery Bt is different. With this, it is possible to appropriately obtain the alternating current impedance, thereby allowing for appropriate deterioration diagnosis for battery Bt.

Moreover, switching circuit 4 includes inductor 43 and energy storage device 44 which are inserted in series on loop circuit Lp, energy storage device 44 may regenerate energy into battery Bt while the alternating current and the alternating current voltage are measured, and impedance measurement device 1 may discharge energy stored in battery Bt to energy storage device 44 while the alternating current and the alternating current voltage are not measured.

By charging battery Bt with the energy regenerated from energy storage device 44 while measuring the impedance as described above and by discharging the energy stored in battery Bt to energy storage device 44 while not measuring the impedance as described above, variation in SOC of battery Bt can be prevented. With this, it is possible to appropriately obtain the alternating current impedance of battery Bt, thereby allowing for appropriate deterioration diagnosis for battery Bt.

Moreover, impedance measurement device 1 may store energy regenerated into battery Bt in energy storage device 44 before changing the frequency of the alternating current to a different frequency.

By feeding the regenerated energy back into energy storage device 44 before changing the frequency for the next measurement as described above, it can be prevented in measurement at each measurement frequency that the voltage of battery Bt is different. With this, it is possible to appropriately obtain the alternating current impedance, thereby allowing for appropriate deterioration diagnosis for battery Bt.

Moreover, switching circuit 4 further includes: first switch 41 inserted in series on loop circuit Lp; second switch 42 connected in parallel to inductor 43 and energy storage device 44; voltage comparator 46 that compares reference voltage Vr and storage voltage Vo of energy storage device 44; and PWM controller 45 that controls first switch 41 and second switch 42. PWM controller 45 may control turning on and off first switch 41 and second switch 42 based on a magnitude relationship between reference voltage Vr and storage voltage Vo compared by voltage comparator 46, to change a flow direction of the current flowing through loop circuit Lp.

By changing the flow direction of the current flowing through loop circuit Lp as described above, the stored energy can be appropriately fed back into battery Bt, and thus the decrease in SOC of battery Bt can be prevented. With this, it is possible to appropriately obtain the alternating current impedance of battery Bt, thereby allowing for appropriate deterioration diagnosis for battery Bt.

Embodiment 2

[Configuration and Measurement Operation of Impedance Measurement Device]

The following describes the schematic configuration of an impedance measurement device according to Embodiment 2.

Figure 5:
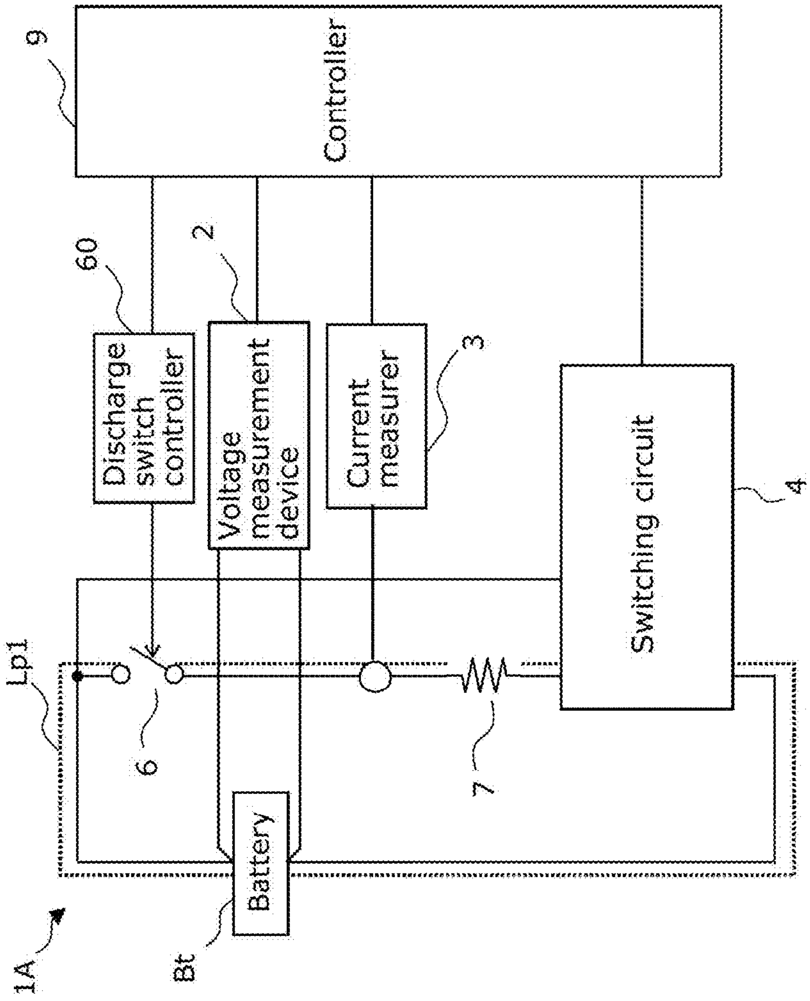
FIG. 5 is a diagram illustrating the schematic configuration of an impedance measurement device according to Embodiment 2.

FIG. 5 is a diagram illustrating the schematic configuration of impedance measurement device 1A according to Embodiment 2. It is to be noted that FIG. 5 also illustrates battery Bt which is a measurement target.

Impedance measurement device 1A is a device that measures the alternating current impedance of battery Bt. Battery Bt is a secondary battery capable of being charged and discharged, e.g., a lithium-ion battery.

As illustrated in FIG. 5, impedance measurement device 1A includes discharge switch 6, limiting resistor 7, and part of switching circuit 4 which form first loop circuit Lp1 together with battery Bt, current measurer 3 connected to a path connecting battery Bt and switching circuit 4, and voltage measurement device 2 connected to the both ends of battery Bt. Impedance measurement device 1A also includes discharge switch controller 60 that controls discharge switch 6.

Discharge switch 6, limiting resistor 7, and part of switching circuit 4 generate a current flowing intermittently through first loop circuit Lp1 from battery Bt. The intermittent current refers to, for example, a current having pulse waveforms (see FIG. 8).

This impedance measurement device 1A changes a time during which the current flows intermittently through first loop circuit Lp1 and a time during which the current does not flow to sweep the frequency of the alternating current from battery Bt. For example, discharge switch controller 60 controls the operation cycle of discharge switch 6 to sweep the frequency of the alternating current through discharge switch 6.

While sweeping the frequency of the alternating current, impedance measurement device 1A measures the alternating current using current measurer 3 and measures the alternating current voltage of battery Bt using voltage measurement device 2 to derive the alternating current impedance of battery Bt. With this configuration, it is possible to appropriately obtain the alternating current impedance for diagnosing deterioration of the battery.

The following describes the detailed configuration and the measurement operation of impedance measurement device 1A.

Figure 6:
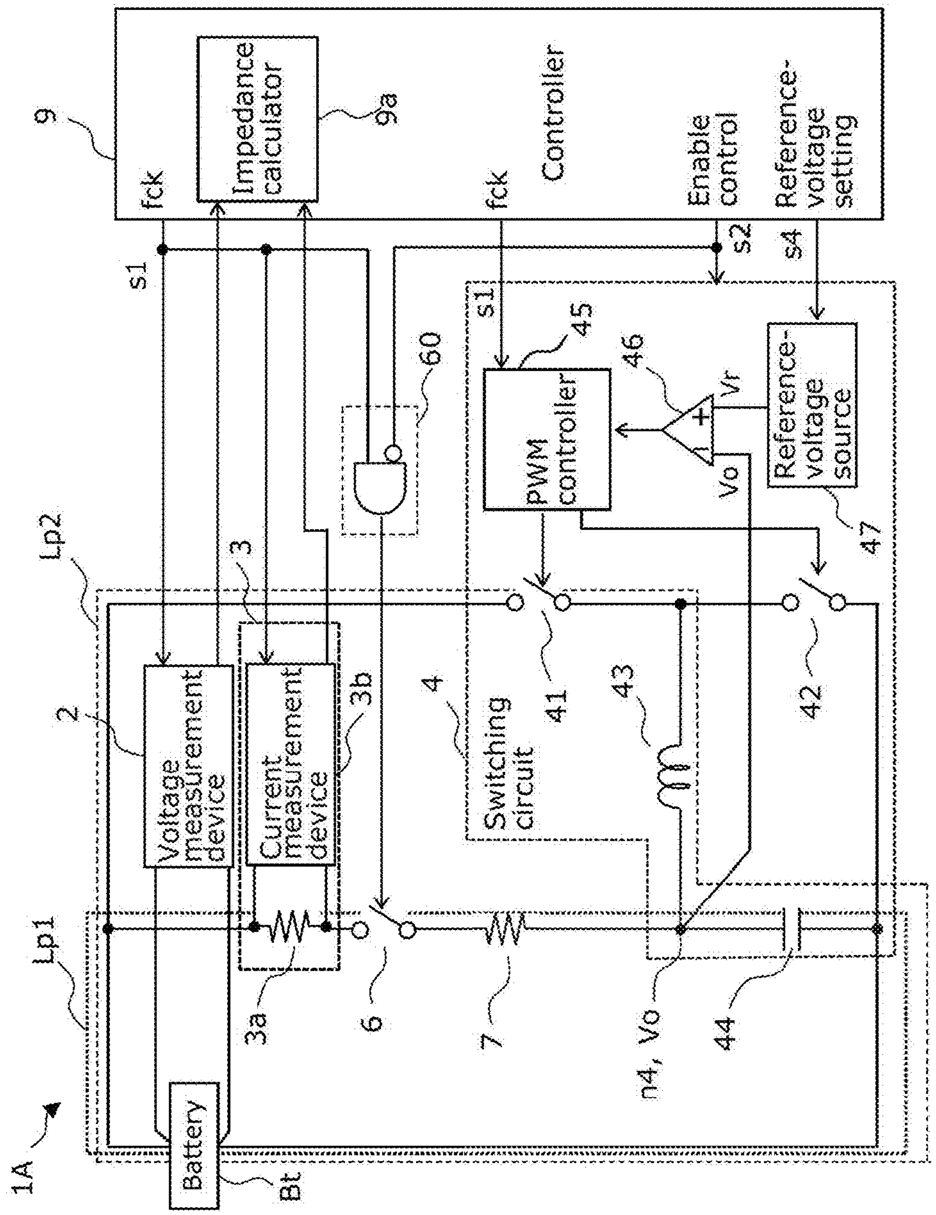
FIG. 6 is a circuit diagram illustrating the impedance measurement device according to Embodiment 2.
Figure 7:
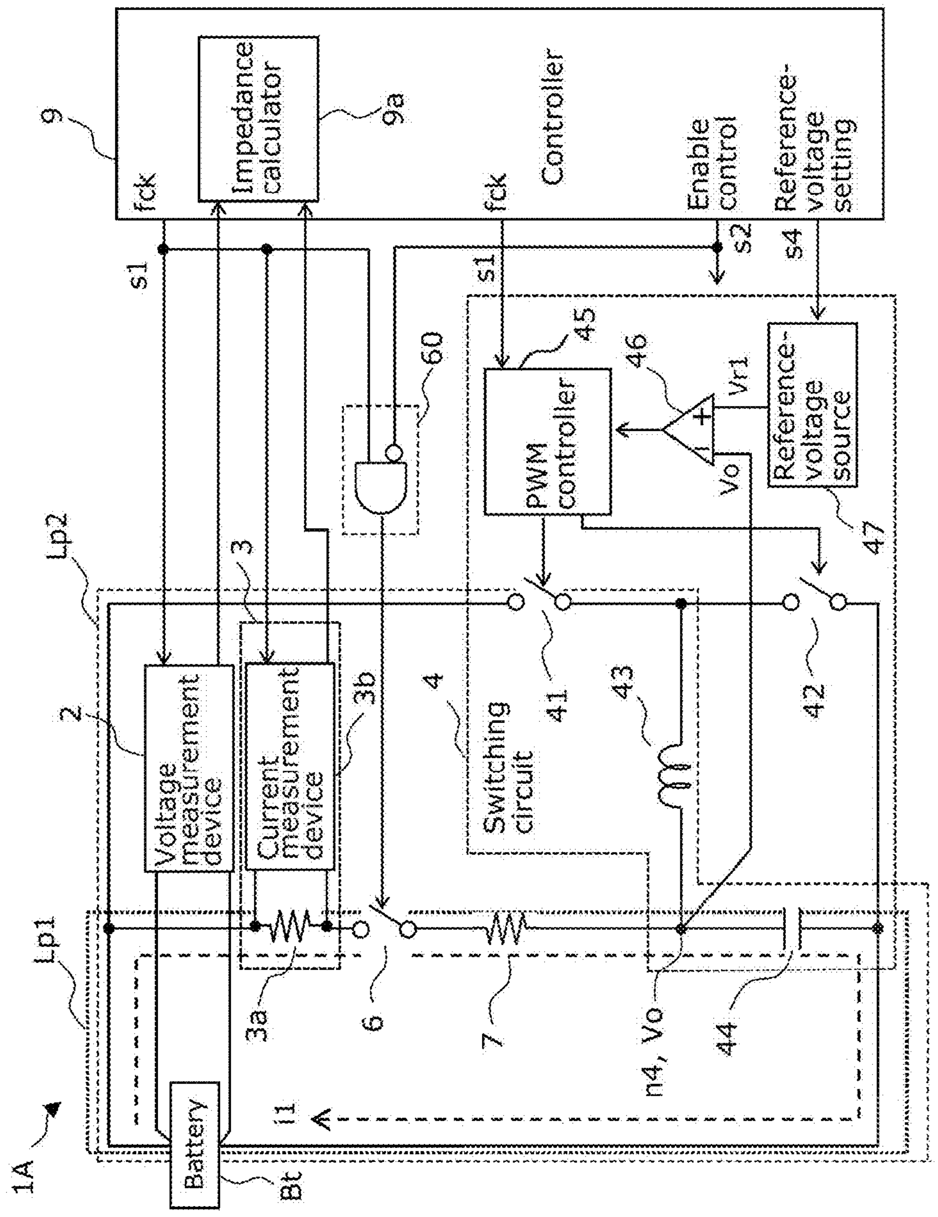
FIG. 7 is a diagram illustrating current flowing through the impedance measurement device in measuring the alternating current impedance of a battery.
Figure 8:
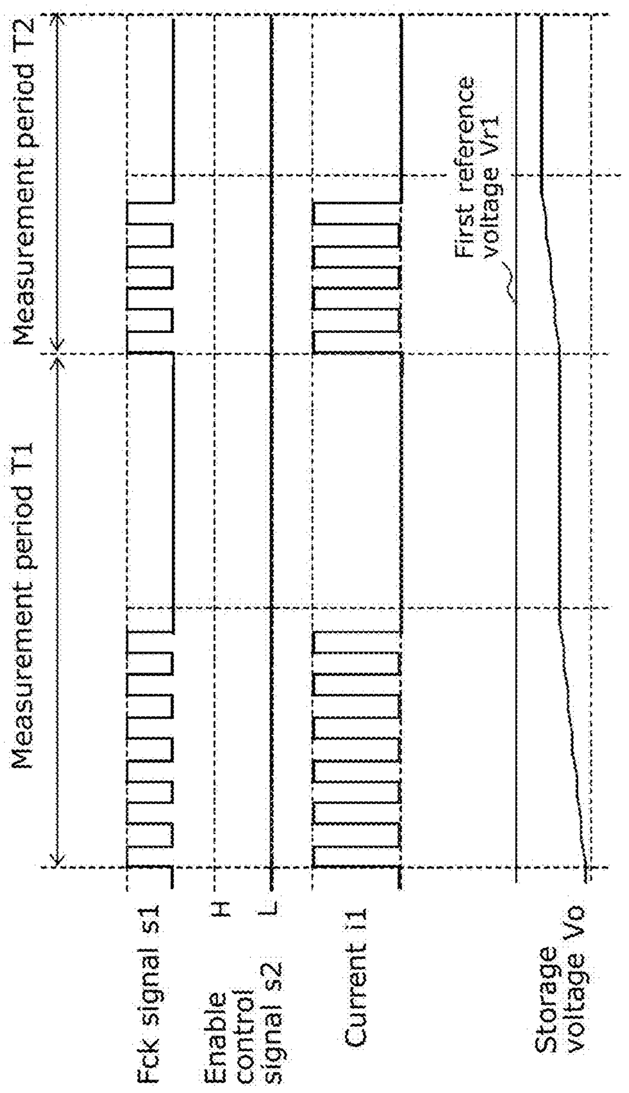
FIG. 8 is a timing chart illustrating the operation of the impedance measurement device in measuring the alternating current impedance of the battery.

FIG. 6 is a circuit diagram illustrating impedance measurement device 1A according to Embodiment 2. FIG. 7 is a diagram illustrating current i1 flowing through impedance measurement device 1A in measuring the alternating current impedance of battery Bt. FIG. 8 is a timing chart illustrating the operation of impedance measurement device 1A in measuring the alternating current impedance of battery Bt.

As illustrated in FIG. 6 and FIG. 7, impedance measurement device 1A includes discharge switch 6, limiting resistor 7, switching circuit 4, discharge switch controller 60, current measurer 3, voltage measurement device 2, and controller 9. Controller 9 includes impedance calculator **9*a*** for calculating the alternating current impedance of battery Bt.

Controller 9 is a circuit that controls voltage measurement device 2, current measurer 3, switching circuit 4, and discharge switch controller 60. For example, this circuit is implemented as a microprocessor.

Controller 9 generates fck signal s1, and outputs fck signal s1 to voltage measurement device 2, current measurer 3, and discharge switch controller 60. It is to be noted that fck signal s1 is also outputted to PWM controller 45 in switching circuit 4. Fck signal s1 is generated as the product of the fixed frequency, which is the basic clock of the microprocessor, and the measurement frequency in measuring the alternating current impedance (see FIG. 8). Also in the present embodiment, the measurement frequency is set to continuously change to different frequencies. For this reason, fck signal s1 is outputted in a half period in accordance with the measurement period, and is not outputted in the remaining half period.

Controller 9 also generates enable control signal s2 for controlling the operation cycle of switching circuit 4, and outputs enable control signal s2 to switching circuit 4 and discharge switch controller 60.

Switching circuit 4 receives enable control signal s2 outputted from controller 9. For example, when enable control signal s2 is high (Hi), switching circuit 4 is activated, and when enable control signal s2 is low (Low), switching circuit 4 is stopped.

Discharge switch controller 60 is, for example, an AND gate circuit having two input terminals connected to controller 9 and one output terminal connected to discharge switch 6. Discharge switch controller 60 receives fck signal s1 and enable control signal s2 outputted from controller 9. For example, discharge switch controller 60 controls turning on and off discharge switch 6 in synchronization with fck signal s1 when enable control signal s2 is low, and turns off discharge switch 6 when enable control signal s2 is high. Controller 9 controls the operation cycle of discharge switch 6 using enable control signal s2 to sweep the frequency of the alternating current from battery Bt (see FIG. 8).

Current measurer 3 is connected to the path connecting battery Bt and switching circuit 4 on first loop circuit Lp1.

Current measurer 3 detects the alternating current flowing from battery Bt based on fck signal s1 outputted from controller 9. The alternating current value detected by current measurer 3 is outputted to impedance calculator 9*a* in controller 9.

Voltage measurement device 2 is connected to the both ends of battery Bt. Voltage measurement device 2 detects the alternating current voltage of battery Bt based on fck signal s1 outputted from controller 9. The alternating current voltage value detected by voltage measurement device 2 is outputted to impedance calculator 9*a* in controller 9.

Impedance calculator 9*a* calculates the alternating current impedance of battery Bt based on the alternating current voltage value outputted from voltage measurement device 2 and the alternating current value outputted from current measurer 3.

Switching circuit 4 forms second loop circuit Lp2 together with battery Bt. Switching circuit 4 includes first switch 41 inserted in series on second loop circuit Lp2, second switch 42 connected in parallel to inductor 43 and energy storage device 44, and PWM controller 45 that PWM controls first switch 41 and second switch 42.

For example, switching circuit 4 has ends one of which is connected to one end of battery Bt, and the other of which is connected to the other end of battery Bt. In switching circuit 4, energy storage device 44 has ends one of which is connected to one end of battery Bt through limiting resistor 7 and current sense resistor 3*a*, and the other of which is connected to the other end of battery Bt. It is to be noted that energy storage device 44 is part of switching circuit 4, and forms first loop circuit Lp1 together with battery Bt, discharge switch 6, and limiting resistor 7. More specifically, one end of first switch 41 is connected to one end of battery Bt. One end of inductor 43 is connected to the other end of first switch 41, one end of energy storage device 44 is connected to the other end of inductor 43, and the other end of energy storage device 44 is connected to the other end of battery Bt. Moreover, one end of second switch 42 is connected to the other end of first switch 41, and the other end of second switch 42 is connected to the other end of battery Bt. Moreover, current sense resistor 3*a*, discharge switch 6, and limiting resistor 7 on first loop circuit Lp1 are connected in parallel to first switch 41 and inductor 43 which are another part of switching circuit 4.

Discharge switch 6, limiting resistor 7, and switching circuit 4 are provided to generate current i1 flowing intermittently through first loop circuit Lp1 from battery Bt.

For example, discharge switch 6 is turned on and off by discharge switch controller 60 to generate current i1 flowing intermittently from battery Bt to energy storage device 44. It is to be noted that, in Embodiment 2, current i2 as described in Embodiment 1 is not generated, and only current i1 is intermittently and repeatedly generated as illustrated in FIG. 8. It is to be noted that the value of current i1 is expressed by equation i1=(VB−Vo)/R, where R is the resistance value of limiting resistor 7, Vo is the storage voltage of energy storage device 44, and VB is the battery voltage of battery Bt.

Energy storage device 44 is a device that stores energy discharged from battery Bt into first loop circuit Lp1. Energy storage device 44 stores energy drawn from battery Bt while the alternating current and the alternating current voltage are measured.

Impedance measurement device 1A regenerates the energy stored in energy storage device 44 into battery Bt through second loop circuit Lp2 while the alternating current and the alternating current voltage are not measured.

In the regenerative operation, switching circuit 4 controls turning on and off first switch 41 and second switch 42 using the PWM signal outputted from PWM controller 45. PWM controller 45 is activated when enable control signal s2 outputted from controller 9 is high, and alternately turns on first switch 41 and second switch 42. It is to be noted that, in the measurement operation, first switch 41 and second switch 42 are not turned on and off since enable control signal s2 is fixed to low. In the present embodiment, switching circuit 4 including first switch 41 and second switch 42 is activated only in the regenerative operation.

Switching circuit 4 includes voltage comparator 46 that compares reference voltage Vr and storage voltage Vo of energy storage device 44. In the regenerative operation, switching circuit 4 controls turning on and off first switch 41 and second switch 42 based on the magnitude relationship between reference voltage Vr and storage voltage Vo compared by voltage comparator 46.

Discharge switch 6 and switching circuit 4 according to the present embodiment are used to switch the operation of impedance measurement device 1A between the measurement operation and the regenerative operation.

For example, controller 9 stops switching circuit 4 and turns on and off discharge switch 6 in synchronization with fck signal s1 to store the energy drawn from battery Bt in energy storage device 44. For example, controller 9 turns off discharge switch 6 using discharge switch controller 60 and controls turning on and off first switch 41 and second switch 42 using PWM controller 45 in switching circuit 4 to regenerate the energy stored in energy storage device 44 into battery Bt.

As described above, impedance measurement device 1A stores the energy drawn from battery Bt during the measurement of the alternating current impedance, whereas regenerates the stored energy into battery Bt. With this configuration, it is possible to prevent the decrease in SOC of battery Bt. With this, it is possible to appropriately obtain the alternating current impedance of battery Bt, thereby allowing for appropriate deterioration diagnosis for battery Bt.

[Regenerative Operation of Impedance Measurement Device]

The regenerative operation of impedance measurement device 1A is described with reference to FIG. 9 and FIG. 10.

Figure 9:
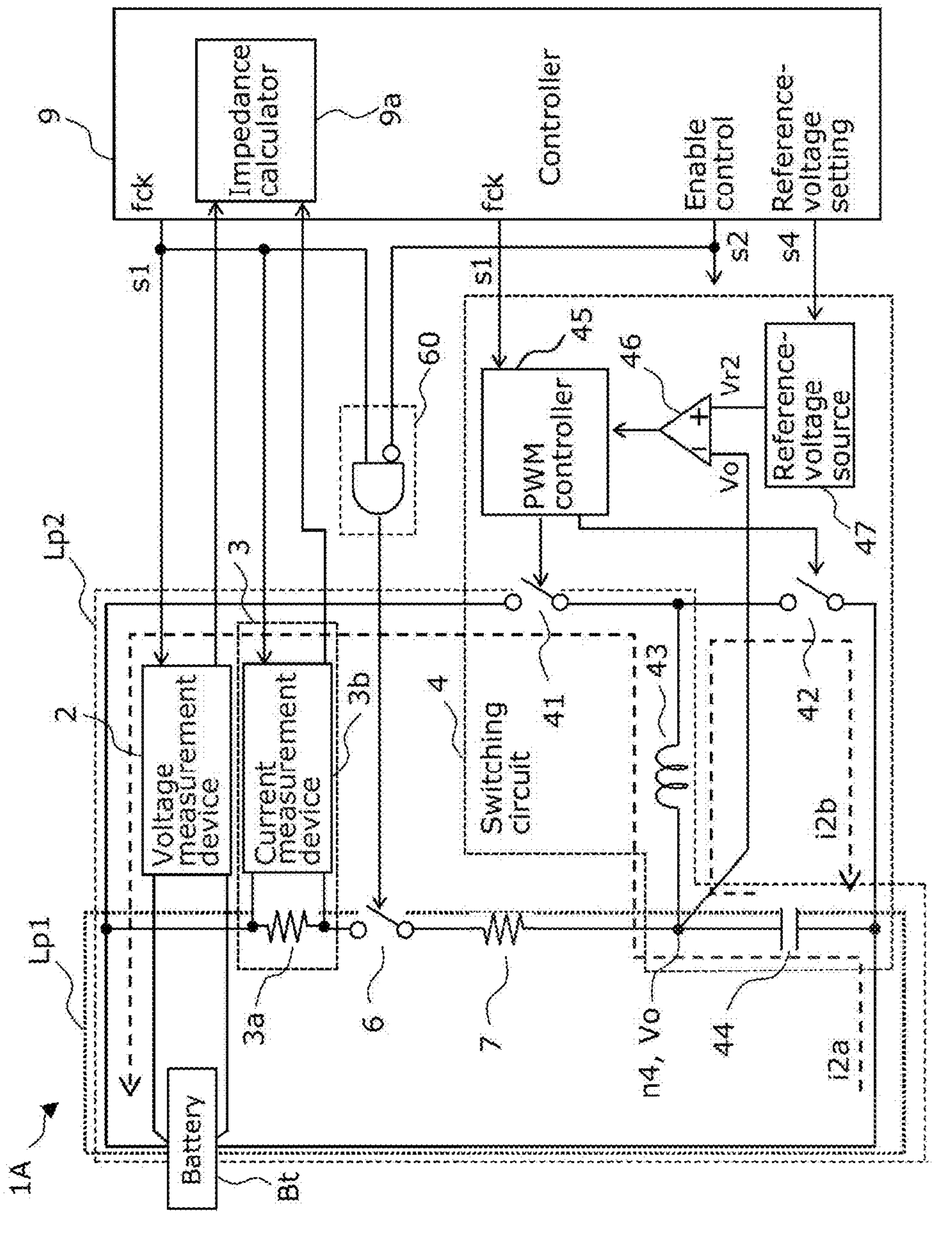
FIG. 9 is a diagram illustrating current flowing through the impedance measurement device in regenerating stored energy into the battery.

FIG. 9 is a diagram illustrating current i2*a* and current i2*b* flowing through impedance measurement device 1A in regenerating stored energy into battery Bt. FIG. 10 is a timing chart illustrating the operation of impedance measurement device 1A in regenerating stored energy into battery Bt.

Figure 10:
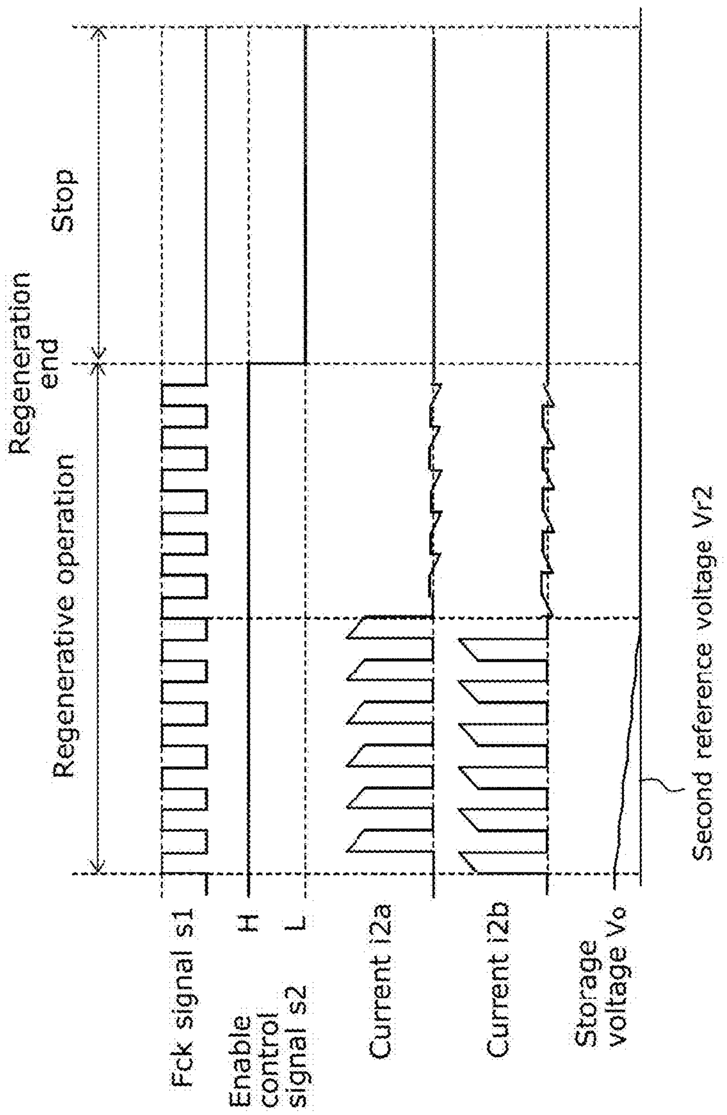
FIG. 10 is a timing chart illustrating the operation of the impedance measurement device in regenerating stored energy into the battery.

FIG. 10 illustrates the time-series variations of fck signal s1, enable control signal s2, current i2*a*, current i2*b*, and storage voltage Vo. It is to be noted that the positive and negative of current i2*a* and current i2*b* are indicated on the assumption that the current flow direction denoted by the dashed arrow in FIG. 10 is positive.

After the measurement of the alternating current impedance, storage voltage Vo of energy storage device 44 is set back to the initial value, and the energy stored in energy storage device 44 is regenerated into battery Bt. In order to set the conditions in the next measurement to be the same as those in the prior measurement, storage voltage Vo is initialized and storage voltage Vo is regenerated into battery Bt. This example also describes a case where the initialization of storage voltage Vo and the regeneration into battery Bt are performed after measurement at a predetermined frequency and before changing the frequency of the alternating current to a different frequency.

Firstly, controller 9 changes enable control signal s2 to high to activate switching circuit 4. It is to be noted that, when enable control signal s2 is high, discharge switch 6 is placed into the turned-off state by the control output from discharge switch controller 60. In this state, controller 9 sets second reference voltage Vr2 to a voltage lower than storage voltage Vo immediately after the measurement, i.e., the initial voltage. Voltage comparator 46 outputs the duty control signal to PWM controller 45 so that storage voltage Vo decreases close to second reference voltage Vr2.

PWM controller 45 increases the ON duty of second switch 42 to pass current from energy storage device 44 to inductor 43. More specifically, switching circuit 4 controls current i2*a* and current i2*b* to alternately flow through at least part of second loop circuit Lp2. Current i2*a* and current i2*b* each have a pulsed waveform of an intermittent flow. Current i2*a* and current i2*b* flow as described above, and thus storage voltage Vo gradually decreases.

When storage voltage Vo reaches second reference voltage Vr2, first switch 41 and second switch 42 are turned on and off so that the average of current i2*a* and current i2*b* becomes 0. With this, storage voltage Vo of energy storage device 44 is set back to the initial voltage equal to the storage voltage before measurement.

Controller 9 changes enable control signal s2 to low to stop switching circuit 4. With this, the regenerative operation of impedance measurement device 1A ends. It is to be noted that the timing of the end of the regenerative operation may be, for example, a predetermined time. Alternatively, after the time when storage voltage Vo becomes constant is detected by monitoring the output from voltage comparator 46, the timing of the end of the regenerative operation may be set to a time after a predetermined period from the detected time.

This impedance measurement device 1A stores the energy drawn from battery Bt during the measurement of the alternating current impedance, and regenerates the stored energy into battery Bt before the next measurement. By feeding energy back into battery Bt as described above, for example, it can be prevented in measurement at each measurement frequency that the voltage of battery Bt is different. With this configuration, it is possible to appropriately obtain the alternating current impedance, thereby allowing for appropriate deterioration diagnosis for battery Bt.

[Advantageous Effects, Etc.]

Impedance measurement device 1A according to Embodiment 2 includes: discharge switch 6, limiting resistor 7, and part of switching circuit 4 which form first loop circuit Lp1 together with battery Bt; current measurer 3 connected to a path connecting battery Bt and discharge switch 6; and voltage measurement device 2 connected to both ends of battery Bt. Discharge switch 6, limiting resistor 7, and part of switching circuit 4 generate current i1 flowing intermittently through first loop circuit Lp1 from battery Bt. Impedance measurement device 1A: changes a time during which current i1 flows intermittently and a time during which current i1 does not flow to sweep a frequency of an alternating current from battery Bt; and measures the alternating current using current measurer 3 and measures an alternating current voltage of battery Bt using voltage measurement device 2 to derive an alternating current impedance of battery Bt.

By measuring the alternating current and measuring the alternating current voltage while sweeping the frequency of the alternating current as described above, it is possible to appropriately obtain the alternating current impedance of battery Bt needed to diagnose deterioration of battery Bt.

Moreover, impedance measurement device 1A further includes discharge switch controller 60 that controls discharge switch 6. Discharge switch controller 60 may control an operation cycle of discharge switch 6 to sweep the frequency of the alternating current through discharge switch 6.

By controlling the operation cycle of discharge switch 6 as described above, the frequency of the alternating current can be appropriately swept through discharge switch 6. With this, it is possible to appropriately obtain the alternating current impedance in a frequency band needed to diagnose deterioration of battery Bt.

Moreover, switching circuit 4 forms second loop circuit Lp2 together with battery Bt, and includes inductor 43 and energy storage device 44 which are inserted in series on second loop circuit Lp2. Energy storage device 44 is part of switching circuit 4, forms first loop circuit Lp1 together with battery Bt, discharge switch 6, and limiting resistor 7, and stores energy drawn from battery Bt while the alternating current and the alternating current voltage are measured, and impedance measurement device 1A regenerates energy stored in energy storage device 44 into battery Bt through second loop circuit Lp2 while the alternating current and the alternating current voltage are not measured.

By storing energy drawn from battery Bt while measuring as described above and by regenerating the stored energy into battery Bt while not measuring as described above, decrease in SOC of battery Bt can be prevented. With this, it is possible to appropriately obtain the alternating current impedance of battery Bt, thereby allowing for appropriate deterioration diagnosis for battery Bt.

Moreover, impedance measurement device 1A may regenerate energy stored in energy storage device 44 into battery Bt before changing the frequency of the alternating current to a different frequency.

By feeding the stored energy back into battery Bt before changing the frequency for the next measurement as described above, it can be prevented in measurement at each measurement frequency that the voltage of battery Bt is different. With this, it is possible to appropriately obtain the alternating current impedance, thereby allowing for appropriate deterioration diagnosis for battery Bt.

Moreover, switching circuit 4 further includes: first switch 41 inserted in series on second loop circuit Lp2; second switch 42 connected in parallel to inductor 43 and energy storage device 44; and PWM controller 45 that controls first switch 41 and second switch 42. Impedance measurement device 1A may: turn off discharge switch 6 using discharge switch controller 60; and control turning on and off first switch 41 and second switch 42 using PWM controller 45 to regenerate energy stored in energy storage device 44 into battery Bt.

With this control, decrease in SOC of battery Bt can be prevented by feeding the stored energy back into battery Bt. With this, it is possible to appropriately obtain the alternating current impedance of battery Bt, thereby allowing for appropriate deterioration diagnosis for battery Bt.

Moreover, switching circuit 4 includes voltage comparator 46 that compares reference voltage Vr and storage voltage Vo of energy storage device 44, and switching circuit 4 may control turning on and off first switch 41 and second switch 42 based on a magnitude relationship between reference voltage Vr and storage voltage Vo compared by voltage comparator 46.

By controlling turning on and off first switch 41 and second switch 42 based on the magnitude relationship between reference voltage Vr and storage voltage Vo as described above, the stored energy can be appropriately fed back into battery Bt and decrease in SOC of battery Bt can be prevented. With this, it is possible to appropriately obtain the alternating current impedance of battery Bt, thereby allowing for appropriate deterioration diagnosis for battery Bt.

OTHER EMBODIMENTS

Although preferred embodiments have been described above, the present disclosure is not limited to the foregoing embodiments.

Although impedance measurement device 1 according to the above embodiment measures the alternating current impedance when battery Bt discharges energy, i.e., when battery Bt is discharged, the present disclosure is not limited to this. For example, impedance measurement device 1 may measure the alternating current impedance when battery Bt is charged with energy.

Although impedance measurement device 1 according to the above embodiment regenerates the stored energy into battery Bt and initializes storage voltage Vo every time measurement at each measurement frequency has been completed, the present disclosure is not limited to this. For example, in order to shorten the total measurement time, the regenerative operation may be performed after all frequency sweeps have been completed.

Moreover, the circuit configuration described in each of the foregoing embodiments is one example, and thus the present disclosure is not limited to the foregoing circuit configurations. In other words, the present disclosure also includes a circuit capable of implementing the distinctive functionality of the present disclosure, like the foregoing circuit configurations. For example, as long as similar functionality as the foregoing circuit configurations can be implemented, the present disclosure also includes a circuit in which an element such as a switching element (a transistor), a resistor element, or a capacitor element is connected in series or in parallel to another element.

Moreover, in the foregoing embodiments, the constitutional elements in the integrated circuit are implemented as hardware. However, part of the constitutional elements in the integrated circuit may be implemented by executing a software program suitable for the part of the constitutional elements. The part of the constitutional elements in the integrated circuit also may be implemented by causing a program executer such as a central processing unit (CPU) or a processor to read out and execute a software program recorded on a recording medium such as a hard disk or a semiconductor memory.

Moreover, a process performed by a specified processing unit in the foregoing embodiments may be performed by another processing unit. Moreover, in the operations described in the foregoing embodiments, the order of processes may be changed, or the processes may be performed in parallel.

The present disclosure may also include embodiments as a result of adding, to the embodiments, various modifications that may be conceived by those skilled in the art, and embodiments obtained by combining elements and functions in the embodiments in any manner without departing from the scope of the present invention.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful as an impedance measurement device for diagnosing deterioration of a battery.

The invention claimed is:

1. An impedance measurement device comprising:
- a switching circuit that forms a loop circuit together with a battery;
- a current measurer connected to a path connecting the battery and the switching circuit; and
- a voltage measurement device connected to both ends of the battery, wherein
- the switching circuit generates a current flowing intermittently through the loop circuit from the battery,
- the impedance measurement device: changes a time during which the current flows intermittently and a time during which the current does not flow to sweep a frequency of an alternating current from the battery; and measures the alternating current using the current measurer and measures an alternating current voltage of the battery using the voltage measurement device to derive an alternating current impedance of the battery, and
- the impedance measurement device charges the battery using energy stored in an energy storage device while the alternating current and the alternating current voltage are not measured.

2. The impedance measurement device according to claim 1, further comprising:
- a controller that controls the switching circuit, wherein
- the controller controls an operation cycle of the switching circuit to sweep the frequency of the alternating current through the switching circuit.

3. The impedance measurement device according to claim 2, wherein
- the switching circuit includes an inductor and the energy storage device which are inserted in series on the loop circuit, and
- the energy storage device stores energy drawn from the battery while the alternating current and the alternating current voltage are measured.

4. The impedance measurement device according to claim 2, wherein
- the switching circuit includes an inductor and an energy storage device which are inserted in series on the loop circuit,
- the energy storage device regenerates energy into the battery while the alternating current and the alternating current voltage are measured, and
- the impedance measurement device discharges energy stored in the battery to the energy storage device while the alternating current and the alternating current voltage are not measured.

5. The impedance measurement device according to claim 4, wherein
- the impedance measurement device stores energy regenerated into the battery in the energy storage device before changing the frequency of the alternating current to a different frequency.

6. The impedance measurement device according to claim 3, wherein the impedance measurement device regenerates energy stored in the energy storage device into the battery before changing the frequency of the alternating current to a different frequency.

7. The impedance measurement device according to claim 3, wherein the switching circuit further includes:

a first switch inserted in series on the loop circuit;

a second switch connected in parallel to the inductor and the energy storage device;

a voltage comparator that compares a reference voltage and a storage voltage of the energy storage device; and a PWM controller that controls the first switch and the second switch, wherein the PWM controller controls turning on and off the first switch and the second switch based on a magnitude relationship between the reference voltage and the storage voltage compared by the voltage comparator, to change a flow direction of the current flowing through the loop circuit.

8. An impedance measurement device comprising:

a discharge switch, a limiting resistor, and part of a switching circuit which form a first loop circuit together with a battery;

a current measurer connected to a path connecting the battery and the discharge switch; and a voltage measurement device connected to both ends of the battery, wherein the discharge switch, the limiting resistor, and the part of the switching circuit generate a current flowing intermittently through the first loop circuit from the battery, the impedance measurement device: changes a time during which the current flows intermittently and a time during which the current does not flow to sweep a frequency of an alternating current from the battery; and measures the alternating current using the current measurer and measures an alternating current voltage of the battery using the voltage measurement device to derive an alternating current impedance of the battery, and the impedance measurement device charges the battery using energy stored in an energy storage device through a second loop circuit while the alternating current and the alternating current voltage are not measured.

9. The impedance measurement device according to claim 8, further comprising:

a discharge switch controller that controls the discharge switch, wherein the discharge switch controller controls an operation cycle of the discharge switch to sweep the frequency of the alternating current through the discharge switch.

10. The impedance measurement device according to claim 9, wherein the switching circuit forms the second loop circuit together with the battery, and includes an inductor and the energy storage device which are inserted in series on the second loop circuit, and the energy storage device is part of the switching circuit, forms the first loop circuit together with the battery, the discharge switch, and the limiting resistor, and stores energy drawn from the battery while the alternating current and the alternating current voltage are measured.

11. The impedance measurement device according to claim 10, wherein the impedance measurement device regenerates energy stored in the energy storage device into the battery before changing the frequency of the alternating current to a different frequency.

12. The impedance measurement device according to claim 10, wherein the switching circuit further includes:

a first switch inserted in series on the second loop circuit;

a second switch connected in parallel to the inductor and the energy storage device; and a PWM controller that controls the first switch and the second switch, and the impedance measurement device:

turns off the discharge switch using the discharge switch controller; and controls turning on and off the first switch and the second switch using the PWM controller to regenerate energy stored in the energy storage device into the battery.

13. The impedance measurement device according to claim 12, wherein the switching circuit includes a voltage comparator that compares a reference voltage and a storage voltage of the energy storage device, and the switching circuit controls turning on and off the first switch and the second switch based on a magnitude relationship between the reference voltage and the storage voltage compared by the voltage comparator.

* * * * *